(12) United States Patent
Park et al.

(10) Patent No.: US 11,437,572 B2
(45) Date of Patent: Sep. 6, 2022

(54) NEGATIVE DIFFERENTIAL RESISTANCE ELEMENT HAVING 3-DIMENSION VERTICAL STRUCTURE

(71) Applicant: Research & Business Foundation Sungkyunkwan University, Suwon-si (KR)

(72) Inventors: Jin Hong Park, Hwaseong-si (KR); Kil Su Jung, Hwaseong-si (KR); Keun Heo, Yongin-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 246 days.

(21) Appl. No.: 16/871,284

(22) Filed: May 11, 2020

(65) Prior Publication Data
US 2020/0357988 A1    Nov. 12, 2020

(30) Foreign Application Priority Data

May 9, 2019    (KR) .......................... 10-2019-0054471

(51) Int. Cl.
*H01L 47/00*    (2006.01)
*H01L 45/00*    (2006.01)
*H01L 27/24*    (2006.01)

(52) U.S. Cl.
CPC ...... *H01L 45/1253* (2013.01); *H01L 27/2481* (2013.01); *H01L 45/145* (2013.01)

(58) Field of Classification Search
CPC .......... H01L 47/00; H01L 45/04; H01L 27/26
See application file for complete search history.

(56) References Cited

U.S. PATENT DOCUMENTS 10,566,389 B2 * 2/2020 Park .................. H01L 27/26

FOREIGN PATENT DOCUMENTS

JP    2008-311452 A    12/2008
KR   10-2017-0109457 A   9/2017
(Continued)

OTHER PUBLICATIONS

Korean Office Action dated Aug. 19, 2020 in counterpart Korean Patent Application No. 10-2019-0054471 (2 pages in Korean).

(Continued)

*Primary Examiner* — Mark V Prenty
(74) *Attorney, Agent, or Firm* — NSIP Law (57) ABSTRACT

Provided is a negative differential resistance element having a 3-dimension vertical structure. The negative differential resistance element having a 3-dimension vertical structure includes: a substrate; a first electrode that is formed on the substrate to receive a current; a second semiconductor material that is formed in some region of the substrate; a first semiconductor material that is deposited in some other region and the first electrode of the substrate and some region of an upper end of the second semiconductor material; an insulator that has a part vertically erected from the substrate, the other part vertically erected from the second semiconductor material, and an upper portion stacked with a first semiconductor material; and a second electrode that is formed at an upper end of the second semiconductor material to output a current, thereby significantly reducing an area of the device and greatly improving device scaling and integration.

5 Claims, 6 Drawing Sheets (56) References Cited

FOREIGN PATENT DOCUMENTS

KR   10-2018-0135341 A   1/2019
KR   10-2018-0135350 A   2/2019

OTHER PUBLICATIONS

Korean Office Action dated Apr. 8, 2020 in corresponding Korean Patent Application No. 10-2019-0054471 (5 pages in Korean).
Shim, Jaewoo et al. "Extremely Large Gate Modulation in Vertical Graphene/WSe2 Heterojunction Barristor Based on a Novel Transport Mechanism", *Advanced Materials*, 2016 (pp. 1-7).

* cited by examiner

NEGATIVE DIFFERENTIAL RESISTANCE ELEMENT HAVING 3-DIMENSION VERTICAL STRUCTURE

CROSS-REFERENCE TO RELATED APPLICATIONS

This application claims the priority of Korean Patent Application No. 10-2019-0054471 filed on May 9, 2019, in the Korean Intellectual Property Office, the disclosure of which is incorporated herein by reference.

BACKGROUND

Field

The present disclosure relates to a negative differential resistance element having a 3-dimension vertical structure, and more particularly, to a negative differential resistance element having a 3-dimension vertical structure that generates a 3-dimension vertical resistance using only a simple insulating film processing process to have multiple peaks.

The negative differential resistance with multiple current peaks may store a plurality of state values, thereby making it possible to manufacture a multi-notation electronic circuit of ternary notation or more.

When the 3-dimension vertical resistance is connected to the negative differential resistance in parallel, a sequential movement of a current peak due to the resistance occurs, so a negative resistance element having a single peak may be made into a negative resistance element having multiple peaks.

Theoretically, N+1 negative resistance peaks may be generated when N 3-dimension vertical resistances are connected in parallel.

In addition, it is configured in three dimensions by using a vertical sidewall resistance, which can greatly reduce an area of a device compared to adding resistance in two dimensions, as in a conventional circuit, and thus has advantages in terms of miniaturization and integration of the device.

DESCRIPTION OF THE RELATED ART

The negative differential resistance element can configure a multi-notation circuit through N-letter current characteristics and reduce static power consumption by reducing an area occupied by a connection wiring by reducing the number of devices. However, there is a limit to increase a multi-notation circuit state by using only a single peak of the negative resistance element, so a negative resistance element having multiple peaks is required.

The existing methods are only to adjust the number and positions of peaks by increasing the number of multi-notation devices or adding resistance required for a circuit. This is an obstacle not only to the area of the entire circuit but also to the miniaturization of the device itself, and the difficulty in the miniaturization/integration is problematic in terms of the power consumption, which was an original advantage.

SUMMARY

An object to be achieved by the present disclosure is to provide a negative differential resistance element having a 3-dimension vertical structure that manufactures different resistances by making a semiconductor material, which can be deposited, into a 3-dimension resistance structure in manufacturing the negative differential resistance element having multiple peaks, thereby manufacturing the negative resistance elements having multiple peaks and a memory and a logic device having multiple states.

According to an aspect of the present disclosure, there is provided a negative differential resistance element having a 3-dimension vertical structure. The negative differential resistance element having a 3-dimension vertical structure includes: a substrate; a first electrode that is formed on the substrate to receive a current; a second semiconductor material that is formed in some region of the substrate; a first semiconductor material that is deposited in some other region and the first electrode of the substrate, and some region of an upper end of the second semiconductor material; an insulator that has a part vertically erected from the substrate, the other part vertically erected from the second semiconductor material, and an upper portion stacked with a first semiconductor material; and a second electrode that is formed at an upper end of the second semiconductor material to output a current.

A first path having only a first horizontal resistance without passing through the insulator vertically erected is formed.

A second path that has a first vertical resistance, a second vertical resistance, and a second horizontal resistance as a 3-dimension vertical resistance as the second path passes through the insulator vertically erected is formed.

N the insulators are vertically erected to have N+1 paths or peaks.

The first semiconductor material and the second semiconductor material include any one of silicon, germanium, III-V group semiconductor, oxide semiconductor, organic semiconductor, transition metal dichalcogenide, and phosphorene which are uniformly deposited.

Details of other exemplary embodiments will be included in the detailed description of the invention and the accompanying drawings.

According to the present disclosure, the negative differential resistance element having a 3-dimension vertical structure can significantly reduce the area of the element through the 3-dimension vertical resistance, greatly improve the device scaling and integration, and make the memory and the logic element having multiple states through the resistance differential resistance element having multiple peaks.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

The present disclosure may be variously modified and have several exemplary embodiments. Therefore, specific exemplary embodiments of the present disclosure will be described in detail with reference to the accompanying drawings. However, it is to be understood that the present disclosure is not limited to a specific exemplary embodiment, but includes all modifications, equivalents, and substitutions without departing from the scope and spirit of the present disclosure. In describing each drawing, similar reference numerals are used for similar components.

Terms such as 'first', 'second', 'A', 'B', and the like, may be used to describe various components, but the components are not to be interpreted to be limited to the terms. The terms are used only to distinguish one component from another component. For example, a first component may be named a second component and the second component may also be similarly named the first component, without departing from the scope of the present disclosure. A term 'and/or' includes a combination of a plurality of related described items or any one of the plurality of related described items.

It is to be understood that when one element is referred to as being "connected to" or "coupled to" another element, it may be connected directly to or coupled directly to another element or be connected to or coupled to another element, having the other element intervening therebetween. On the other hand, it should be understood that when one element is referred to as being "connected directly to" or "coupled directly to" another element, it may be connected to or coupled to another element without the other element interposed therebetween.

Terms used in the present specification are used only in order to describe specific exemplary embodiments rather than limiting the present disclosure. Singular forms are intended to include plural forms unless the context clearly indicates otherwise. It will be further understood that the terms "comprises" or "have" used in this specification, specify the presence of stated features, steps, operations, components, parts mentioned in this specification, or a combination thereof, but do not preclude the presence or addition of one or more other features, numerals, steps, operations, components, parts, or a combination thereof.

Unless indicated otherwise, it is to be understood that all the terms used in the specification including technical and scientific terms have the same meaning as those that are generally understood by those who skilled in the art. Terms generally used and defined by a dictionary should be interpreted as having the same meanings as meanings within a context of the related art and should not be interpreted as having ideal or excessively formal meanings unless being clearly defined otherwise in the present disclosure.

Through the present specification and claims, unless explicitly described otherwise, "comprising" any components will be understood to imply the inclusion of other components rather than the exclusion of any other components.

Hereinafter, a negative differential resistance element having a 3-dimension vertical structure according to the present disclosure will be described with reference to the accompanying drawings.

Figure 1:
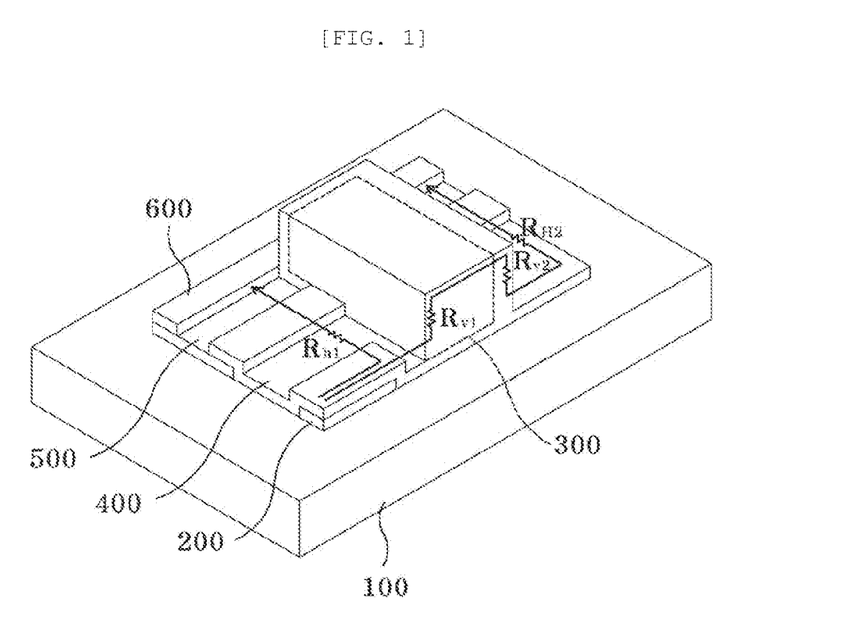
FIG. 1 is a perspective view of a negative differential resistance element having a 3-dimension vertical structure according to the present disclosure.

As illustrated in FIG. 1, the negative differential resistance element having a 3-dimension vertical structure according to the present disclosure includes a bottom substrate 100, a first electrode 200, an insulator 300, a first semiconductor material 400, a second semiconductor material 500, and a second electrode 600.

The first electrode 200 is made of or coated with a titanium (Ti) or aurum (Au) material having excellent conductivity, and is a configured to input or output a current.

Similarly, the second electrode 600 is also made of or coated with a titanium (Ti) or aurum (Au) material having excellent conductivity, and is a configured to input or output a current.

That is, when a current is input to the first electrode 200, a current may be output to the second electrode 600, and conversely, when a current is input to the second electrode 600, a current may be output to the first electrode 600.

The insulator 300 may be made of organic/inorganic compounds such as polymethyl methacrylate (PMMA) and PR.

The first semiconductor material 400 includes all semiconductor materials such as silicon, germanium, III-V group semiconductor, oxide semiconductor, organic semiconductor, transition metal dichalcogenide, and phosphorene which can be uniformly deposited on a side wall of the insulating layer 300.

In addition, the second semiconductor material 500 includes all semiconductor materials such as silicon, germanium, III-V group semiconductor, oxide semiconductor, organic semiconductor, transition metal dichalcogenide, and phosphorene.

In the negative differential resistance element having a 3-dimension vertical structure according to the present disclosure having the above-described configuration, the insulator 300 is patterned, and then the first semiconductor material 400 having conductivity is deposited to form the first semiconductor material 400 on the side wall and upper portion of the insulator 300, so the 3-dimension vertical resistance formed in series along a current path of a bottom of the substrate 100 → a side wall of the insulator 300 → a top surface of the insulator 300 → the other side wall of the insulator 300 → the other bottom based on the insulator 300 can be made.

The structure of the negative differential resistance element having a 3-dimension vertical structure according to the present disclosure will be described in more detail with reference to FIG. 2.

Figure 2:
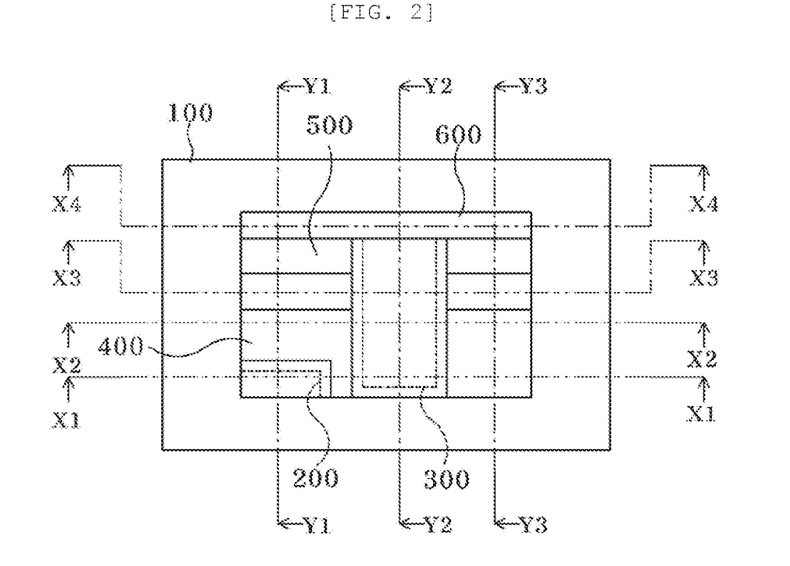
FIG. 2 is a plan view of the negative differential resistance element having a 3-dimension vertical structure according to the present disclosure.

First, in FIG. 2, an X1 section is defined as an X-section first metal region, an X2 section is defined as a resistance region, an X3 section is defined as an X-section bonding region, an X4 section is defined as an X-section second metal region, a Y1 section is defined as a Y-section metal region, a Y2 section is defined as an insulator region, and a Y3 section is defined as a bonding region.

Figure 3:
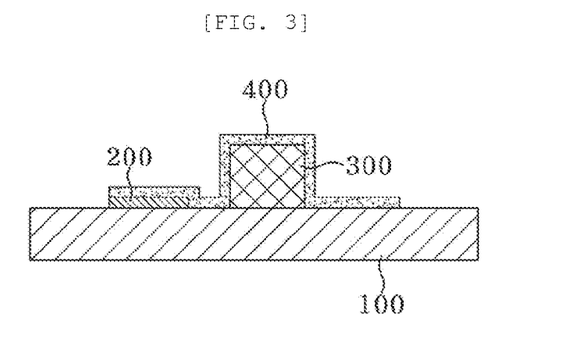
FIG. 3 is a diagram illustrating an X-section first metal region of the negative differential resistance element having a 3-dimension vertical structure according to the present disclosure.

As illustrated in FIG. 3, the X-section first metal region has a structure in which the first electrode 200 and the insulator 300 are patterned on the substrate 100 and the first semiconductor material 400 having conductivity is deposited.

As the first semiconductor material 400 is deposited, the first semiconductor material 400 is formed on an upper end portion and one side wall of the first electrode 200, and the first semiconductor material 400 is formed on a bottom surface of the substrate 100 between the first metal 200 and the insulator 300, and is formed on the side wall, the top surface, and the other side wall of the insulator 300, and the right bottom surface of the substrate 100 based on the insulator 300.

Figure 4:
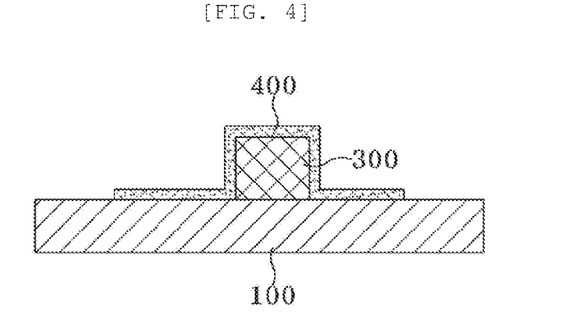
FIG. 4 is a diagram illustrating a resistance region of the negative differential resistance element having a 3-dimension vertical structure according to the present disclosure.

As illustrated in FIG. 4, the resistance region has a structure in which the insulator 300 is patterned on the substrate 100 and the first semiconductor material 400 having conductivity is deposited.

The first semiconductor material 400 is formed on the side wall, the top surface, the other side wall of the insulator 300, and the left and right bottom surfaces of the substrate 100 based on the insulator 300.

Figure 5:
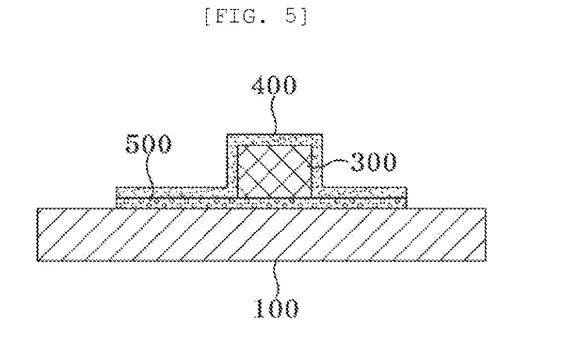
FIG. 5 is a diagram illustrating an X-section bonding region of the negative differential resistance element having a 3-dimension vertical structure according to the present disclosure.

As illustrated in FIG. 5, the X-section bonding region has a structure in which the second semiconductor material 500 is stacked on the substrate 100, the insulator 300 is patterned on the first semiconductor material 200, and the first semiconductor material 400 having conductivity is deposited.

The first semiconductor material 400 is formed on the side wall, the top surface, the other side wall of the insulator 300, and the left and right bottom surfaces of the second semiconductor material 500 based on the insulator 300.

Figure 6:
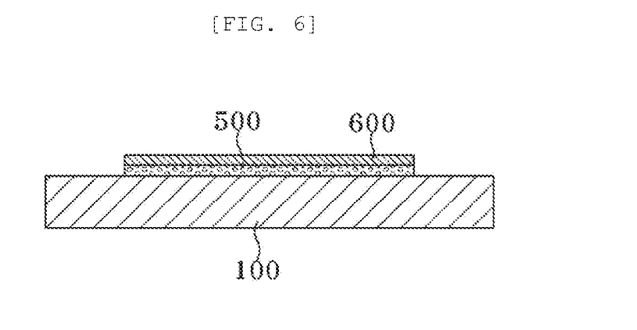
FIG. 6 is a diagram illustrating an X-section second metal region of the negative differential resistance element having a 3-dimension vertical structure according to the present disclosure.

As illustrated in FIG. 6, the X-section second metal region has a structure in which the second semiconductor material 500 and the second electrode 600 are sequentially stacked on the substrate 100, and does not include the first semiconductor material 400.

Figure 7:
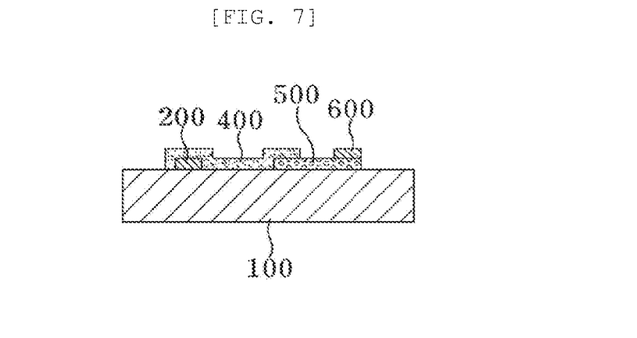
FIG. 7 is a diagram illustrating a Y-section metal region of the negative differential resistance element having a 3-dimension vertical structure according to the present disclosure.

As illustrated in FIG. 7, the Y-section metal region has a structure in which the first electrode 200 and the second semiconductor material 500 are formed on the substrate 100 with spaced apart from each other at predetermined intervals, the first semiconductor material 400 having conductivity is deposited, and the second electrode 600 is stacked on a part of the second semiconductor material 500.

On the other hand, the first semiconductor material 400 is formed on the upper end portion and one side wall of the first electrode 200, is formed on the exposed substrate 100 with spaced apart from the first electrode 200 and the second semiconductor material 500, and is formed on one side wall and a part of the upper end portion of the second semiconductor material 500.

Figure 8:
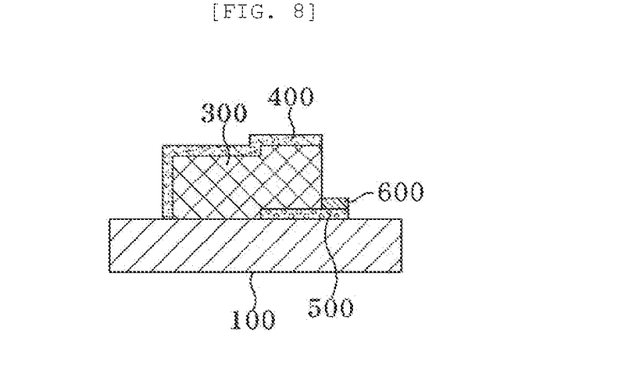
FIG. 8 is a diagram illustrating an insulator region of the negative differential resistance element having a 3-dimension vertical structure according to the present disclosure.

As illustrated in FIG. 8, the insulator region has a structure in which the second semiconductor material 500 is formed on a part of the substrate 100, the insulator 300 is formed to be stepped on the second semiconductor material 500 and other parts of the substrate 100, and the first semiconductor material 400 is deposited on the stepped insulator 300.

The first semiconductor material 400 is formed on the upper end surface and one side surface of the insulator 300, and formed on the remaining surface of the substrate 100 remaining after the second semiconductor material 500 and the insulator 300 are formed.

Figure 9:
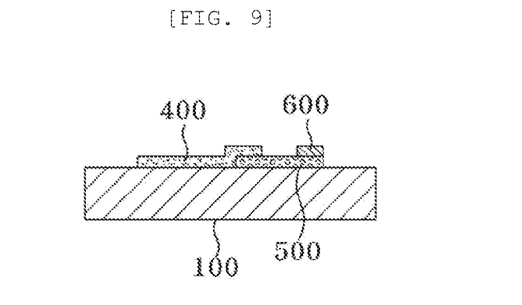
FIG. 9 is a diagram illustrating the insulator region of the negative differential resistance element having a 3-dimension vertical structure according to the present disclosure.

As illustrated in FIG. 9, the Y-section bonding region has a structure in which the second semiconductor material 500 is formed on a part of the substrate 100, the first semiconductor material 500 is formed on a part of the upper end portion and the side wall of the second semiconductor material 500 and the remaining substrate 100, and the first electrode 200 is formed on the first semiconductor material 400 stacked on the substrate 100.

Referring to FIG. 1 again, the negative differential resistance element having a 3-dimension vertical structure according to the present disclosure having the above-described structure includes a first path having only a first horizontal resistance $R_{h1}$ and a second path having a first vertical resistance $R_{V1}$, a second vertical resistance $R_{V2}$, and a second horizontal resistance $R_{h2}$.

When a current is input to the first electrode 200, the input current is distributed and flows in the first path and the second path, wherein the current passes through the first horizontal resistance $R_{h1}$ on the first path and passes through the first vertical resistance $R_{V1}$, the second vertical resistance $R_{V2}$, and the horizontal resistance $R_{h2}$ on the second path, and various values are output to the second electrode 600.

That is, the negative differential resistance element having a 3-dimension vertical structure according to the present disclosure may be manufactured as the negative differential resistance element that has a current path having several different resistances by being simultaneously bonded to the first semiconductor material 400 used for 3-dimension vertical resistance and the second semiconductor material 500 having a heterojunction.

Figure 10:
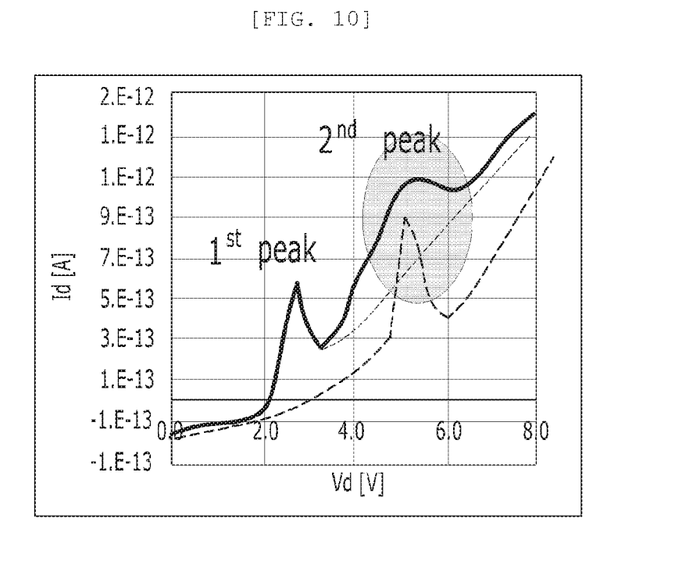
FIG. 10 is a 2-peak negative differential resistance element current-voltage graph using one negative differential resistance element and one 3-dimension vertical resistance according to the present disclosure.

In the negative differential resistance element having a 3-dimension vertical structure according to the present disclosure described above, a sample/device is manufactured through a prior experiment, and as shown in FIG. 10, one negative differential resistance element and one 3-dimension vertical resistance are used to implement a 2-peak negative differential resistance element.

Figure 11:
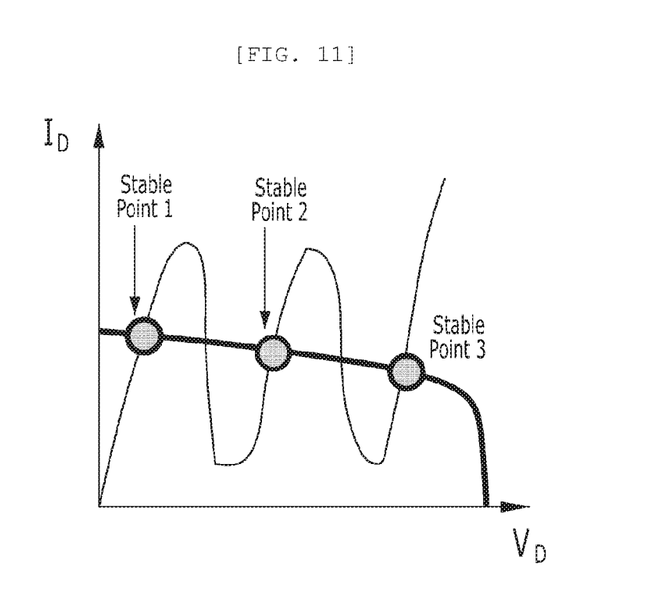
FIG. 11 is a graph illustrating an implementation of three operating points through a load line analysis of a voltage-current characteristic curve of a 2-peak negative differential resistance element according to the present disclosure.

Here, when N additional 3-dimensional vertical resistance structures proposed in the present disclosure are used, a negative differential resistance element having N+1 peaks may be implemented. The negative differential resistance element having multiple peaks may be applied to a memory having multiple states as illustrated in FIG. 11.

The spirit of the present disclosure has been illustratively described hereinabove. It will be appreciated by those skilled in the art that various modifications and alterations may be made without departing from the essential characteristics of the present disclosure. Accordingly, exemplary embodiments disclosed in the present disclosure are not to limit the spirit of the present disclosure, but are to describe the spirit of the present disclosure. The scope of the present disclosure is not limited to these exemplary embodiments. The scope of the present disclosure should be interpreted by the following claims, and it should be interpreted that all the spirits equivalent to the following claims fall within the scope of the present disclosure.

What is claimed is:

1. A negative differential resistance element having a 3-dimension vertical structure, comprising:
    a substrate;
    a first electrode that is formed on the substrate to receive a current;
    a second semiconductor material that is formed in some region of the substrate;
    a first semiconductor material that is deposited in some other region and the first electrode of the substrate and some region of an upper end of the second semiconductor material;
    an insulator that has a part vertically erected from the substrate, the other part vertically erected from the second semiconductor material, and an upper portion stacked with the first semiconductor material; and
    a second electrode that is formed at an upper end of the second semiconductor material to output a current.

2. The negative differential resistance element of claim 1, wherein a first path having only a first horizontal resistance without passing through the insulator vertically erected is formed.

3. The negative differential resistance element of claim 2, wherein a second path that has a first vertical resistance, a second vertical resistance, and a second horizontal resistance as a 3-dimension vertical resistance as the second path passes through the insulator vertically erected are formed.

4. The negative differential resistance element of claim 1, wherein N the insulators are vertically erected to have N+1 paths or peaks.

5. The negative differential resistance element of claim 1, wherein the first semiconductor material and the second semiconductor material include any one of silicon, germanium, III-V group semiconductor, oxide semiconductor, organic semiconductor, transition metal dichalcogenide, and phosphorene which are uniformly deposited.

* * * * *